(12) United States Patent
Kawakami et al.

(10) Patent No.: US 6,444,598 B1
(45) Date of Patent: Sep. 3, 2002

(54) INSULATOR COMPOSITION, INSULATOR PASTE AND LAMINATED ELECTRONIC PART

(75) Inventors: Hiromichi Kawakami, Moriyama; Toshiki Tanaka, Otsu, both of (JP)

(73) Assignee: Murata Manufacturing Co. Ltd (JP)

( * ) Notice: Subject to any disclaimer, the term of this patent is extended or adjusted under 35 U.S.C. 154(b) by 90 days.

(21) Appl. No.: 09/656,362

(22) Filed: Sep. 6, 2000

(30) Foreign Application Priority Data

Sep. 13, 1999 (JP) .......................................... 11-258374

(51) Int. Cl.[7] .................. C03C 3/062; C03C 3/078; C03C 3/087; C03C 3/089; C03C 10/06

(52) U.S. Cl. ................. 501/32; 501/8; 501/9; 501/65; 501/72; 501/73

(58) Field of Search ............... 501/8, 9, 16, 17, 501/20, 21, 32, 65, 72, 73

(56) References Cited

U.S. PATENT DOCUMENTS

| | | | | |
|---|---|---|---|---|
| 4,424,251 A | * | 1/1984 | Sugishita et al. ........... 174/258 |
| 4,749,665 A | * | 6/1988 | Yano et al. .................... 501/15 |
| 5,024,975 A | * | 6/1991 | Hartmann .................... 428/209 |
| 5,725,808 A | * | 3/1998 | Tormey et al. .............. 252/514 |
| 6,232,251 B1 | * | 5/2001 | Terashi et al. .............. 428/901 |
| 6,270,880 B1 | * | 8/2001 | Kawakami et al. ......... 428/210 |
| 6,348,424 B1 | * | 2/2002 | Hzeyama et al. ........ 156/89.11 |

* cited by examiner

Primary Examiner—David Sample
(74) Attorney, Agent, or Firm—Dickstein, Shapiro, Morin & Oshinsky L.L.P.

(57) ABSTRACT

An insulator composition which can be sintered at a relatively low temperature and which exhibits a low dielectric constant and a thermal expansion coefficient suitable for forming an insulator layer of a laminated electronic part contains a crystallized glass composition containing $SiO_2$, MgO and CaO as main components, and $Al_2O_3$, an amorphous silicate glass composition, and a ceramic composition. The composition ratio by weight % ($SiO_2$, MgO, CaO) of the main components of the crystallized glass composition lies in a region surrounded by point A (30, 25, 45), point B (30, 5, 65), point C (45, 5, 50) and point D (45, 25, 30) shown in a ternary composition diagram thereof. The thermal expansion coefficient of the insulator composition after sintering can easily be changed by changing the content ratio of the crystallized glass composition, the amorphous silicate glass composition and the ceramic composition.

16 Claims, 3 Drawing Sheets

FIG. 6

INSULATOR COMPOSITION, INSULATOR PASTE AND LAMINATED ELECTRONIC PART

BACKGROUND OF THE INVENTION

1. Field of the Invention

The present invention relates to an insulator composition used as an electrical insulating material in a laminated electronic part, for example, such as a thick film printed multilayered circuit board, insulator paste comprising a mixture of the insulator composition and an organic vehicle, and a laminated electronic part such as a multilayered circuit board comprising an insulating layer obtained by burning the insulator paste.

More specifically, the present invention relates to an improvement for making the insulator composition or insulator paste sinterable at relatively low temperature, and for making it possible to freely change the thermal expansion coefficient of an insulating layer obtained by burning the insulator composition or paste while maintaining a low dielectric constant.

2. Description of the Related Art

As a result of recent developments in semiconductor integrated circuit devices such as IC and LSI, decreases in size of various electronic apparatus and increases in density thereof have rapidly proceeded. Accordingly, the circuit board for mounting the semiconductor integrated circuit devices thereon has been required to have a smaller size and higher density, thereby advancing the formation of fine and multilayered electric wiring on the circuit board.

This multilayered circuit board is classified into the following types on the basis of the manufacturing method thereof.

(1) A multilayered circuit board obtained by preparing a plurality of ceramic green sheets for forming an insulator layer, forming a conductor pattern for forming a conductor layer on each of the ceramic green sheets, laminating the plurality of ceramic green sheets on each of which the conductor pattern is formed to form a laminated product, and then burning the laminated product.

(2) A sequential burning type multilayered circuit board obtained by a printing technique in which the step of coating insulator paste for an insulator layer on a ceramic sintered sheet or ceramic green sheet as a base material by printing includes burning in this step, and then coating a conductor paste for a conductor layer by printing, and the burning is repeated.

(3) A simultaneous burning type multilayered circuit board obtained by a printing technique in which the steps of coating insulator paste for an insulator layer on a ceramic sintered sheet or ceramic green sheet as a base material by printing and coating a conductor paste for a conductor layer by printing are repeated to obtain a laminated product, and then the resultant laminated product is integrally burned.

On the other hand, it is known that the propagation velocity of a signal in a conductor decreases as the dielectric constant of a peripheral material increases, and an electric insulating material for high-velocity propagation is required to have a low dielectric constant.

A known example of such electric insulating materials having a low dielectric constant is cordierite. The cordierite is also known as a material having a low thermal expansion coefficient.

In the above-described multilayered circuit board (2) or (3), it is important to match the thermal expansion coefficient of the board with the thermal expansion coefficient of the insulator layer. Mismatching between these thermal expansion coefficients causes the problem of warping the resultant multilayered circuit board. Particularly, the use of alumina as the base material, and cordierite as the insulator layer causes significant warping because cordierite has a low thermal expansion coefficient.

The conductor which constitutes the conductor layer formed for providing circuit wiring in the multilayered circuit board generally has a thermal expansion coefficient of as high as 10 ppm/° C., thereby possibly causing mismatching between the thermal expansion coefficients of the conductor layer and the insulator layer in the multilayered circuit board (1), and mismatching between the conductor layer, the base material, and the insulator layer in the multilayered circuit board (2) or (3). Such mismatching between the thermal expansion coefficients also cause the problem of warping. The degree of warping depends upon the density of circuit wiring provided by the conductor layer.

Therefore, the material for the insulator layer is desired to have a thermal expansion coefficient which can easily be changed so as to decrease mismatching of thermal expansion coefficients as much as possible according to a circuit design comprising the base material and the conductor layer.

SUMMARY OF THE INVENTION

Accordingly, it is an object of the present invention to provide an insulator composition and insulator paste which can be used as materials of an insulator layer satisfying the above desire. Another object of the present invention is to provide a laminated electronic part such as a multilayered circuit board obtained by using the insulator paste.

The present invention is directed to an insulator composition comprising a crystallized glass composition containing $SiO_2$, MgO and CaO as main components, and $Al_2O_3$, an amorphous silicate glass composition, and a ceramic composition. In order to solve the above technical problems, the crystallized glass composition comprises the main components at a composition ratio by weight % ($SiO_2$, MgO, CaO) in the region surrounded by point A (30, 25, 45), point B (30, 5, 65), point C (45, 5, 50) and point D (45, 25, 30) shown in the ternary composition diagram of FIG. 1.

The crystallized glass composition can be generally obtained by melting raw materials, and then rapidly cooling the resultant melt. However, in the specification of the invention, the term "the crystallized glass composition" means a "glass composition having a crystal phase" and/or a "glass composition having the ability to precipitate a crystal phase by heat treatment".

In the present invention, the crystallized glass composition preferably comprises about 5 to 28 parts by weight of $Al_2O_3$ based on a total of 100 parts by weight of the main components.

In heat treatment of the crystallized glass composition at a temperature higher than the crystallization temperature, at least one crystal phase of merwinite ($Ca_3MgSi_2O_8$), monticellite ($CaMgSiO_4$), calcium silicate (at least one of $CaSiO_3$, $Ca_3Si_2O_7$, $Ca_2SiO_4$ and $Ca_3SiO_5$), gehlenite ($Ca_2Al_2SiO_7$) and diopside ($CaMgSi_2O_6$) is preferably precipitated.

Although the above specified crystal phases are generally precipitated after heat treatment, the crystal phases are partially precipitated before heat treatment in some cases. Besides these crystal phases, in some cases, the crystallized glass composition further contains another crystal phase. Such another crystal phase is also precipitated after heat treatment or partially precipitated before heat treatment.

The crystallized glass composition may further comprise 0 to about 20 parts by weight of $B_2O_3$, and 0 to about 5 parts by weight of at least one of $Li_2O$, $K_2O_3$ and $Na_2O$.

In the present invention, in a preferred embodiment, the amorphous silicate glass composition comprises borosilicate glass. In this case, the borosilicate glass preferably contains about 75 weight % or more of $SiO_2$. The borosilicate glass preferably contains $SiO_2$, $B_2O_3$ and $K_2O_3$ at a composition ratio by weight % ($SiO_2$, $B_2O_3$, $K_2O$) in the region surrounded by point E (75, 25, 0), point F (75, 20, 5), point G (855, 10, 5) and point H (85, 15, 0) shown in the ternary composition diagram of FIG. 2.

In the present invention, in a preferred embodiment, the ceramic composition comprises at least one of alumina ($Al_2O_3$), forsterite ($Mg_2SiO_4$) and quartz ($SiO_2$).

The insulator composition of the present invention preferably comprises about 50 weight % or less of ceramic composition.

In a specified embodiment of the present invention, the thermal expansion coefficient of the crystallized glass composition after sintering is set to about 7 ppm/° C. or more, and the thermal expansion coefficient of the amorphous silicate glass composition after sintering is set to about 4 ppm/° C. or less so that the thermal expansion coefficient of the resultant insulator composition after sintering is in the range of about 2 to 12 ppm/° C.

In the insulator composition of the present invention, besides a crystal phase formed by the ceramic composition, at least one crystal phase of merwinite ($Ca_3MgSi_2O_8$), monticellite ($CaMgSiO_4$), calcium silicate (at least one of $CaSiO_3$, $Ca_3Si_2O_7$, $Ca_2SiO_4$ and $Ca_3SiO_5$), gehlenite ($Ca_2Al_2$ diopside ($CaMgSi_2O_6$) is preferably precipitated after burning.

The insulator composition is generally powdery, and is mixed with an organic vehicle to form paste. In order to form an insulator layer, for example, the insulator paste is coated as a thick film on an appropriate base material by printing, and then burned.

Therefore, the present invention is also directed to insulator paste comprising the insulator composition and an organic vehicle, and a laminated electronic part such as a multilayered circuit board comprising an insulator layer obtained by burning the insulator paste. The laminated electronic part of the present invention has a structure in which the insulator layer and the conductor layer obtained, e.g., by burning a silver-system, copper-system or gold-system conductor paste, are laminated.

DESCRIPTION OF THE PREFERRED EMBODIMENTS

Figure 3:
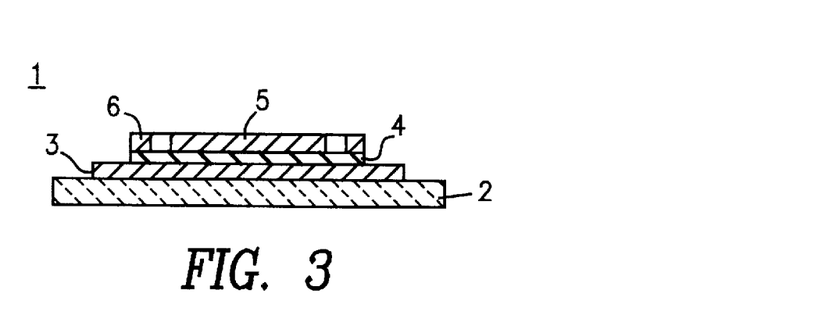
FIG. 3 is a sectional view showing a laminated electronic part in accordance with an embodiment of the present invention.

FIG. 3 is a sectional view showing a laminated electronic part 1 in accordance with an embodiment of the present invention. Although the laminated electronic part 1 constitutes a capacitor, it can be understood that the capacitor having the structure shown in FIG. 3 is only an example of a basic element provided in a multilayered circuit board.

The laminated electronic part 1 comprises a plate-shaped substrate 2, for example, made of alumina, a conductor layer 3 formed on the substrate 2 to function as one electrode of the capacitor, an insulator layer 4 formed on the conductor layer 3 to function as a dielectric member, and a conductor layer 5 formed on the insulator layer 4 to function as the other electrode of the capacitor. Also, a guard layer 6 made of the same material as the conductor layer 5 is formed to surround the conductor layer 5.

In the laminated electronic part 1, each of the conductor layers 3 and 5 and the guard layer 6 is formed by coating a silver-system, copper-system, or gold-system conductor paste, and the burning the coating.

The insulator layer 4 is formed by coating an insulator paste containing an insulator composition of the present invention, and then burning the coating.

Typical examples of the insulator composition of the present invention will be described below with reference to examples.

The structure of the laminated electronic part 1 shown in FIG. 3 is only an example. For example, the lamination order of the conductor layer and the insulator layer on the substrate, and the coated patterns, etc. can be arbitrarily changed.

As the method of manufacturing the laminated electronic part 1, various methods can be used. Namely, the method of manufacturing each of the multilayered circuit boards (1) to (3) described above in "Description of the Related Art" can be appropriately used.

Typical examples of the insulator composition of the present invention will be described in further detail below with reference to examples.

EXAMPLE 1

The insulator composition of the present invention comprises a crystallized glass composition, an amorphous silicate glass composition, and a ceramic composition. The present invention also provides insulator paste containing the insulator composition, and a laminated electronic part comprising an insulator layer obtained by burning the insulator paste. The examples of the present invention are successively described on the bases of experimental examples 1 to 6 outlined below.

Experimental example 1 . . . Composition of the main components of crystallized glass composition;

Experimental example 2 . . . Content of $Al_2O_3$ of crystallized glass composition;

Experimental example 3 . . . Content of an additive component of crystallized glass composition;

Experimental example 4 . . . Composition of amorphous silicate glass composition;

Experimental example 5 . . . Powder mixture of crystallized glass composition, amorphous silicate glass composition, and ceramic composition, i.e., insulator composition; and Experimental example 6 . . . Laminated electronic part formed by using paste containing insulator composition.

EXPERIMENTAL EXAMPLE 1

$SiO_2$, $MgCO_3$, $CaCO_3$ and $Al_2O_3$ were prepared as starting raw materials of the crystallized glass composition, and mixed at the composition ratios (parts by weight) shown in Table 1, and each of the resultant mixtures was melted at a temperature of 1500 to 1750° C. to form molten glass. Then, the molten glass was poured into pure water to be rapidly cooled, and ground to obtain a glass powder.

TABLE 1

| Sample No. | Glass composition (parts by weight) | | | | Corresponding reference character in ternary composition diagram |
|---|---|---|---|---|---|
| | $SiO_2$ | MgO | CaO | $Al_2O_3$ | |
| a1 | 30 | 25 | 45 | 25 | A |
| a2 | 30 | 5 | 65 | 25 | B |
| a3 | 45 | 5 | 50 | 25 | C |
| a4 | 45 | 25 | 30 | 25 | D |
| a5 | 36 | 15 | 49 | 25 | |
| a6* | 20 | 20 | 60 | 25 | |
| a7* | 40 | 30 | 30 | 25 | |
| a8* | 50 | 10 | 40 | 25 | |

Figure 1:
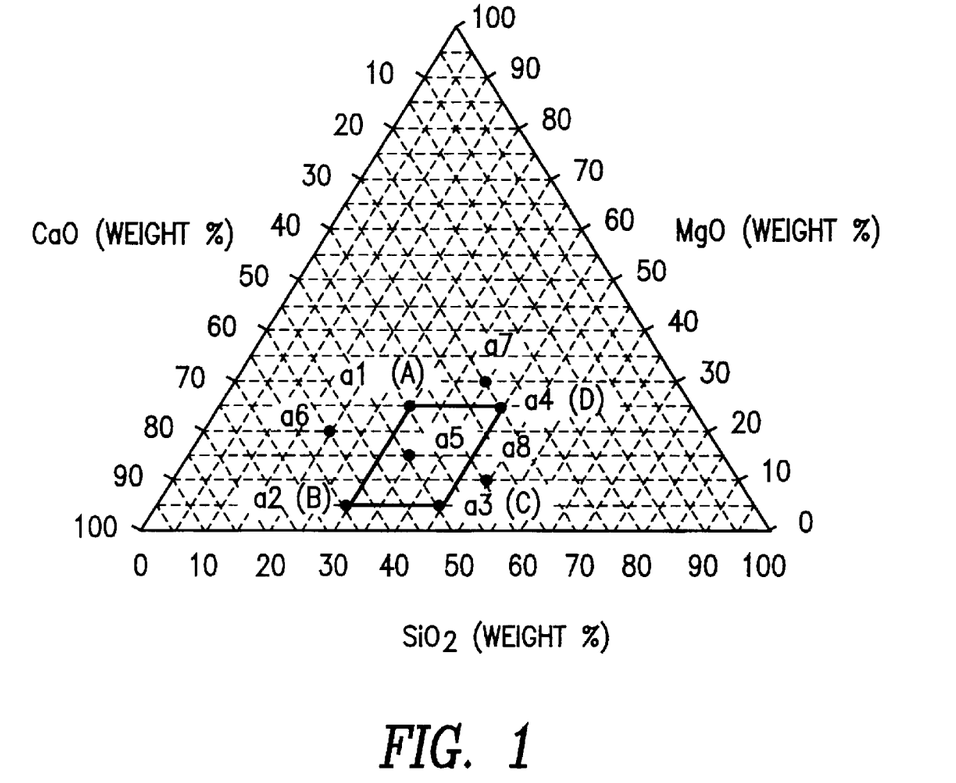
FIG. 1 is a ternary composition diagram showing the composition range of $SiO_2$, MgO and CaO contained as main components in a crystallized glass composition contained in an insulator composition of the present invention.

In the samples shown in Table 1, the content of $Al_2O_3$ was constant at 25 parts by weight, and the composition ratio of $SiO_2$, MgO and CaO as main components was changed. The composition ratios of the samples are plotted in a ternary composition diagram of FIG. 1. In FIG. 1, reference characters a1 to a8 respectively correspond to the sample Nos. of Table 1.

Next, an organic binder and toluene as a solvent were added and mixed with each of the glass powders, and the resultant mixture was sufficiently kneaded by a ball mill to prepare a slurry in which the glass powder was uniformed dispersed. Then, the slurry was degassed under reduced pressure.

Next, by using each the thus-obtained slurries, a green sheet of 0.2 mm thick was formed on a film by casting using a doctor blade. Each of the green sheets was dried, separated from the film and then punched to form a green sheet of a predetermined size.

A plurality of the green sheets were laminated and then pressed to obtain a compact.

Next, the thus-obtained compact was burned at 900° C. for 1 hour at a heating rate of 200° C. hour to obtain a crystallized glass sintered compact.

With respect to the crystallized glass sintered compact, the relative dielectric constant ($\epsilon_r$), insulating resistance (logIR), the thermal expansion coefficient, sinterability at 900° C. or less and crystal phases were evaluated.

More specifically, a sample having the dimensions of 10 mm×10 mm×0.5 mm for the relative dielectric constant measurement was prepared, in which a silver electrode was formed over the entire surface of one of the sides, and formed in a pattern having a peripheral guard on the other side. The electrostatic capacity of this sample was measured by a LCR meter under conditions of a frequency of 1 MHZ, a voltage of 1 Vrms and a temperature of 25° C., and the relative dielectric constant was calculated from the electrostatic capacity.

For the insulating resistance, a sample having the same dimensions as the relative dielectric constant was used, and a DC voltage of 100 V was applied to the sample for 1000 hours under conditions of a temperature of 85° C. and a relative humidity of 85%. A DC voltage of 50 V was further applied to the sample for 60 seconds, followed by measurement. The insulating resistance was measured for evaluating insulation reliability.

For the thermal expansion coefficient, a sample having the dimensions of 2 mm×2 mm×10 mm was used, and the average thermal expansion coefficient in the temperature range of 30° C. to 400° C. was measured.

The crystal phases were identified by an X-ray diffraction pattern of the surface of an evaluation sample by X-ray diffraction analysis.

The results of evaluation are shown in Table 2. In Tables 1 and 2, sample Nos. marked with * are out of the range of the present invention.

TABLE 2

| Sample No. | Relative dielectric constant $\epsilon_r$ | Insulating resistance logIR | Thermal expansion coefficient (ppm/° C.) | Sinterability at 900° C. or less | Presence of crystal phase | | | | |
|---|---|---|---|---|---|---|---|---|---|
| | | | | | Mer | Mo | CS | Geh | Di |
| a1 | 9.0 | >9 | 9.5 | Possible | o | o | o | o | x |
| a2 | 9.5 | >9 | 9.5 | Possible | o | o | o | o | x |
| a3 | 8.5 | >9 | 8.5 | Possible | o | x | o | o | o |
| a4 | 8.5 | >9 | 8.0 | Possible | o | o | x | o | o |
| a5 | 9.0 | >9 | 9.0 | Possible | o | o | x | o | x |
| a6* | — | <9 | — | Impossible | — | — | — | — | — |
| a7* | 8.5 | >9 | 6.5 | Possible | x | o | x | o | o |
| a8* | 8.0 | >9 | 6.0 | Possible | x | x | o | x | o |

In Table 2 and Tables 4, 6 and 10 below, in the column "Presence of crystal phase", "Mer" represents merwinite; "Mo" signifies monticellite; "CS" is calcium silicate; "Geh" represents gehlenite; and "Di" means diopside.

The reason for limiting the composition range of the main components of the crystallized glass composition contained in the insulator composition of the present invention is described with reference to Tables 1 and 2, and FIG. 1.

With respect to the main components $xSiO_2$-$y$MgO-$z$CaO (wherein x, y and z are by weight %) of the crystallized glass composition, samples a1 to a5 in the range of the present invention lie in the region surrounded by point A (30, 25, 45), point B (30, 5, 65), point C (45, 5, 50) and point D (45, 25, 30) shown in the ternary composition diagram of FIG. 1.

In these samples a1 to a5, at least one crystal phase of merwinite ($Ca_3MgSi_2O8$), monticellite ($CaMgSiO_4$), calcium silicate (at least one of $CaSiO_3$, $Ca_3Si_2O_7$, $Ca_2SiO_4$ and $Ca_3SiO_5$), gehlenite ($Ca_2Al_2SiO_7$) and ($CaMgSi_2O_6$), which have relatively high thermal expansion coefficients as oxide ceramics, is precipitated. Also, these samples can be sintered at a temperature of 900° C. or less, and have a relative dielectric constant of 11 or less, an insulating resistance (LogIR) of over 9, and preferred characteristics as electric insulating materials.

These samples a1 to a5 also have a thermal expansion coefficient of about 7 ppm/° C. or more. Therefore, it is understood that when each of the crystallized glass compositions is mixed with an amorphous silicate glass composition having a low thermal expansion coefficient evaluated in Experimental Example 4, which will be described below, the thermal expansion coefficient of the mixture as an insulator composition can easily be changed, as evaluated in Experimental Example 5, which will be described below.

On the other hand, sample a6 beyond the range of the present invention cannot be sufficiently sintered at 900° C. or less, and causes deterioration in the insulating resistance.

Each of samples a7 and a8 beyond the range of the present invention has a thermal expansion coefficient of less than about 7 ppm/° C., and thus it cannot be much expected that the thermal expansion coefficient of a mixture of each of the samples and an amorphous silicate glass composition having a low thermal expansion coefficient can be easily changed.

EXPERIMENTAL EXAMPLE 2

The same operation as Experimental Example 1 was repeated except that glass powders had the compositions shown in Table 3 to obtain crystallized glass sintered compacts.

TABLE 3

| Sample | Glass composition (parts by weight) | | | |
|---|---|---|---|---|
| No. | $SiO_2$ | MgO | CaO | $Al_2O_3$ |
| a9* | 30 | 25 | 45 | 0 |
| a10* | 45 | 5 | 50 | 0 |
| a11 | 30 | 25 | 45 | 5 |
| a12 | 45 | 5 | 50 | 5 |
| a13 | 30 | 25 | 45 | 28 |
| a14 | 45 | 5 | 50 | 28 |
| a15* | 30 | 25 | 45 | 35 |
| a16* | 45 | 5 | 50 | 35 |
| a17 | 36 | 15 | 49 | 15 |

Table 3 indicates that in Experimental Example 2, the composition ratios of $SiO_2$, MgO and CaO as the main components of the crystallized glass compositions lie in the range of the present invention, i.e., in the region surrounded by points A, B, C, and D shown in the ternary composition diagram of FIG. 1, while the content of $Al_2O_3$ is changed in the range of 0 to 35 parts by weight based on a total of 100 parts by weight of the main components.

For each of the samples a9 to a17 shown in Table 3, the relative dielectric constant, insulation resistance, thermal expansion coefficient, sinterability at 900° C. or less, and crystal phases were evaluated by the same method as Experimental Example 1. The results are shown in Table 4. In Tables 3 and 4, samples Nos. marked with * lie out of the range of the present invention or the preferred range thereof.

TABLE 4

| Sample No. | Relative dielectric constant $\epsilon_r$ | Insulating resistance logIR | Thermal expansion coefficient (ppm/° C.) | Sinterability at 900° C. or less | Presence of crystal phase | | | | |
|---|---|---|---|---|---|---|---|---|---|
| | | | | | Mer | Mo | CS | Geh | Di |
| a9* | — | <9 | — | Impossible | — | — | — | — | — |
| a10* | — | <9 | — | Impossible | — | — | — | — | — |
| a11 | 9.5 | >9 | 11.0 | Possible | o | o | o | o | x |
| a12 | 9.0 | >9 | 11.5 | Possible | o | x | o | o | o |
| a13 | 9.0 | >9 | 8.0 | Possible | o | o | o | o | x |
| a14 | 8.5 | >9 | 8.0 | Possible | o | x | o | o | o |
| a15* | — | <9 | — | Impossible | — | — | — | — | — |
| a16* | — | <9 | — | Impossible | — | — | — | — | — |
| a17 | 8.0 | >9 | 10.5 | Possible | o | o | x | o | x |

The preferred range of the $Al_2O_3$ content of the crystallized glass composition is described below with reference to Tables 3 and 4.

In samples a11 to a14 and a17, 5 to 28 parts by weight of $Al_2O_3$ is added to a total of 100 parts by weight of $SiO_2$, MgO and CaO as the main components. As a result, these samples can be sintered at a temperature of 900° C. or less, and have a relative dielectric constant of 12 or less, an insulating resistance (logIR) of over 9, and preferable characteristics as electric insulating materials.

These samples a11 to a14 and a17 also have a thermal expansion coefficient of about 7 ppm/° C. or more. Therefore, like in samples a1 to a5 in Experimental Example 1, it is understood that by mixing each of the samples a11 to a14 and 17 with an amorphous silicate glass composition having a low thermal expansion coefficient, the thermal expansion coefficient as an insulator composition can easily be changed.

On the other hand, samples a9 and a10 do not contain $Al_2O_3$, and thus lie out of the range of the present invention. In samples a9 and 10, with an $Al_2O_3$ content of less than 5 parts by weight, sintering at 900° C. or less is insufficient, and the insulating resistance thus deteriorates.

In samples a15 and 16, with an $Al_2O_3$ content of over 28 parts by weight, sintering at 900° C. or less is insufficient, and the insulating resistance thus deteriorates.

EXPERIMENTAL EXAMPLE 3

The same operation as Experimental Example 1 was repeated except that $H_3BO_3$, $K_2CO_3$, $Na_2CO_3$ and $Li_2CO_3$ were further prepared as starting raw materials for crystallized glass compositions, and glass powders respectively had the compositions shown in Table 5 to obtain crystallized glass sintered compacts.

TABLE 5

| Sample | Glass composition (parts by weight) | | | | | | | |
|---|---|---|---|---|---|---|---|---|
| No. | $SiO_2$ | MgO | CaO | $Al_2O_3$ | $B_2O_3$ | $K_2O$ | $Li_2O$ | $Na_2O$ |
| a18 | 45 | 5 | 50 | 25 | 20 | 0 | 0 | 0 |
| a19* | 45 | 5 | 50 | 25 | 30 | 0 | 0 | 0 |
| a20 | 45 | 5 | 50 | 25 | 0 | 5 | 0 | 0 |
| a21* | 45 | 5 | 50 | 25 | 0 | 10 | 0 | 0 |
| a22 | 45 | 5 | 50 | 25 | 0 | 0 | 5 | 0 |
| a23* | 45 | 5 | 50 | 25 | 0 | 0 | 10 | 0 |
| a24 | 45 | 5 | 50 | 25 | 0 | 0 | 0 | 5 |
| a25* | 45 | 5 | 50 | 25 | 0 | 0 | 0 | 10 |
| a26 | 45 | 5 | 50 | 25 | 0 | 1 | 1 | 1 |
| a27* | 45 | 5 | 50 | 25 | 0 | 3 | 3 | 3 |
| a28 | 45 | 5 | 50 | 25 | 10 | 1 | 1 | 1 |
| a29* | 45 | 5 | 50 | 25 | 10 | 3 | 3 | 3 |

Table 5 indicates that in Experimental Example 3, the composition ratios of $SiO_2$, MgO and CaO and $Al_2O_3$ of the crystallized glass compositions are the same as sample a3 shown in Table 3, and lie in the range of the present invention, while at least one of $B_2O_3$, $K_2O$, $Li_2O$ and $Na_2O$ is added as an additive component at different contents.

For each of the samples a18 to a29 shown in Table 5, the relative dielectric constant, insulation resistance, thermal expansion coefficient, sinterability at 900° C. or less, and crystal phases were evaluated by the same method as Experimental Example 1. The results are shown in Table 6. In Tables 5 and 6, samples Nos. marked with * lie out of the preferred range of the present invention.

components. In this example containing over 20 parts by weight of $B_2O_3$, the thermal expansion coefficient is less than 7.

The preferred ranges of the contents of $K_2O$, $Li_2O$, and $Na_2O$ of the crystallized glass composition are described below with reference to Tables 5 and 6.

In samples a20, a22, a24, a26 and a28, at least one of $K_2O$, $Li_2O$ and $Na_2O$ is added at a total content of 5 parts by weight or less based on a total of 100 parts by weight of the main components. As a result, the samples can be sintered at a temperature of 900° C. or less, and have a relative dielectric constant of 12 or less, an insulating resistance (logIR) of over 9, and preferable characteristics as electric insulating materials.

On the other hand, in samples a21, 23, a25, a27 and a29, the total content of at least one of $K_2O$, $Li_2O$, and $Na_2O$ exceeds 5 parts by weight, the insulating resistance deteriorates.

In the samples a18, a20, a22, a24, a26 and a28 which lie in the preferred range in Experimental Example 3, like in samples a1 to a5 shown in Tables 1 and 2, it is understood that by mixing each of the samples with an amorphous silicate glass composition having a low thermal expansion coefficient, the thermal expansion coefficient as an insulator composition can easily be changed.

EXPERIMENTAL EXAMPLE 4

$SiO_2$, $H_3BO_3$ and $K_2CO_3$ were prepared as starting raw materials of the amorphous silicate glass composition and mixed at the composition ratios (parts by weight) shown in Table 7, and each of the resultant mixtures was melted at a temperature of 1500 to 1750° C. to form molten glass. Then,

TABLE 6

| Sample | Relative dielectric constant | Insulating resistance | Thermal expansion coefficient | Sinterability at 900° C. | Presence of crystal phase | | | | |
|---|---|---|---|---|---|---|---|---|---|
| No. | $\epsilon_r$ | logIR | (ppm/° C.) | or less | Mer | Mo | CS | Geh | Di |
| a18 | 7.5 | >9 | 7.0 | Possible | x | x | o | o | o |
| a19* | 7.5 | >9 | 6.5 | Possible | x | x | o | o | o |
| a20 | 8.5 | >9 | 8.5 | Possible | o | x | o | o | o |
| a21* | 9.0 | 9> | 9.0 | Possible | x | x | o | o | o |
| a22 | 8.5 | >9 | 8.5 | Possible | o | x | o | o | o |
| a23* | 9.0 | 9> | 8.5 | Possible | x | x | o | o | o |
| a24 | 8.5 | 9> | 8.5 | Possible | o | x | o | o | o |
| a25* | 9.0 | 9> | 8.5 | Possible | x | x | o | o | o |
| a26 | 8.5 | >9 | 8.5 | Possible | o | x | o | o | o |
| a27* | 8.5 | 9> | 8.5 | Possible | x | x | o | o | o |
| a28 | 8.5 | >9 | 8.5 | Possible | x | x | o | o | o |
| a29* | 8.5 | 9> | 8.5 | Possible | x | x | o | o | o |

The preferred range of the $B_2O_3$ content of the crystallized glass composition is described below with reference to Tables 5 and 6.

In sample a18, 20 parts by weight of $B_2O_3$ is added to a total of 100 parts by weight of $SiO_2$, MgO and CaO as the main components. Even with $B_2O_3$ added at a content of 20 parts by weight or less, the sample can be sintered at a temperature of 900° C. or less, and has a relative dielectric constant of 12 or less, an insulating resistance (logIR) of over 9, and preferable characteristics as an electric insulating material.

On the other hand, sample a19 contains 30 parts by weight of $B_2O_3$ based on a total of 100 parts by weight of the main the molten glass was poured into pure water to be rapidly cooled and ground to obtain a glass powder.

TABLE 7

| Sample | Glass composition (parts by weight) | | | Corresponding reference character in ternary |
|---|---|---|---|---|
| No. | $SiO_2$ | $B_2O_3$ | $K_2O$ | composition diagram |
| b1 | 75 | 25 | 0 | E |
| b2 | 75 | 20 | 5 | F |
| b3 | 85 | 10 | 5 | G |
| b4 | 85 | 15 | 0 | H |

TABLE 7-continued

| Sample No. | Glass composition (parts by weight) | | | Corresponding reference character in ternary composition diagram |
|---|---|---|---|---|
| | $SiO_2$ | $B_2O_3$ | $K_2O$ | |
| b5 | 80 | 18 | 2 | |
| b6* | 90 | 5 | 5 | |
| b7* | 70 | 10 | 20 | |
| b8* | 60 | 30 | 10 | |

Figure 2:
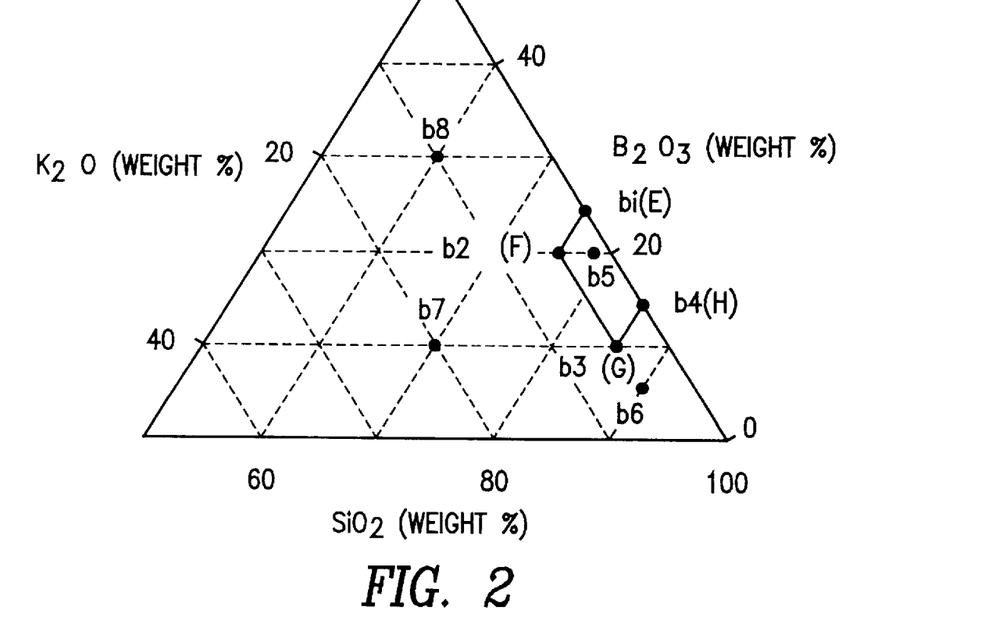
FIG. 2 is a ternary composition diagram showing a preferred composition range of $SiO_2$, $B_2O_3$ and $K_2O_3$ contained in borosilicate glass as an amorphous silicate glass composition contained in an insulator composition of the present invention.

The composition ratios of the samples of the amorphous silicate glass composition of the present invention shown in Table 7 are plotted in the ternary composition diagram of FIG. 2. In FIG. 2, reference characters b1 to b8 respectively correspond to the sample Nos. of Table 7.

Next, for each of the glass powders, the same treatment and operation as Experimental Example 1 were repeated to form an amorphous glass sintered compact.

With respect to the amorphous glass sintered compact, the relative dielectric constant ($\epsilon_r$), insulating resistance (logIR), the thermal expansion coefficient, sinterability at 900° C. or less, and crystal phases were evaluated by the same method as Experimental Example 1. The results of evaluation are shown in Table 8. In Tables 7 and 8, sample Nos. marked with * are out of the range of the present invention.

TABLE 8

| Sample No. | Relative dielectric constant $\epsilon_r$ | Insulating resistance logIR | Thermal expansion coefficient (ppm/° C.) | Sinterability at 900° C. or less |
|---|---|---|---|---|
| b1 | 3.9 | >9 | 2.7 | Possible |
| b2 | 4.6 | >9 | 3.4 | Possible |
| b3 | 4.5 | >9 | 3.3 | Possible |
| b4 | 3.9 | >9 | 2.7 | Possible |
| b5 | 4.0 | >9 | 2.8 | Possible |
| b6* | — | <9 | — | Impossible |
| b7* | 7 | <9 | 4.6 | Possible |
| b8* | 5.5 | <9 | 3.9 | Possible |

The preferred composition of the amorphous silicate glass composition is described with reference to Tables 7 and 8, and FIG. 2.

With respect to the composition $xSiO_2$-$yB_2O_3$-$zK_2O$ (wherein x, y and z are by weight %) of the amorphous glass composition, samples b1 to b5 having preferred compositions lie in the region surrounded by point E (75, 25, 0), point F (75, 20, 5), point G (85, 10, 5), and point H (85, 15, 0) shown in the ternary composition diagram of FIG. 1.

These samples can be sintered at a temperature of 900° C. or less, and have a relative dielectric constant of 12 or less, an insulation resistance (LogIR) of over 9, and preferred characteristics as electric insulating materials.

These samples b1 to b5 also have a thermal expansion coefficient of 4 ppm/° C. or less. Therefore, it is understood that when each of the samples is mixed with each of the crystallized glass compositions having a high thermal expansion coefficient prepared in the above experimental examples 1 to 3, the thermal expansion coefficient of the mixture as an insulator composition can easily be changed.

On the other hand, sample b6 beyond the preferred range cannot be sufficiently sintered at 900° C. or less, and causes deterioration in the insulating resistance.

Similarly, each of samples b7 and b8 beyond the preferred range also causes deterioration in the insulating resistance.

EXPERIMENTAL EXAMPLE 5

In Experimental Example 5, a crystallized glass composition evaluated in the above Experimental Examples 1 to 3 was mixed with an amorphous silicate glass composition evaluated in Experimental Example 4, and a ceramic composition was added to the resultant mixture so that the resultant powder mixture as an insulator composition could be evaluated. Particularly, in this experimental example 5, sample glass a17 shown in Tables 3 and 4 was selected as a representative of the crystallized glass composition, and sample glass b5 shown in Tables 7 and 8 was selected as a representative of amorphous silica glass. The characteristics of a powder mixture containing these sample glasses a17 and b5 and the ceramic composition were confirmed.

As the ceramic composition, a powder of each of crystalline $SiO_2$ (quartz), $Al_2O_3$ (alumina) and $Mg_2SiO_4$ (forsterite) was prepared, and these powders, glass a 17 as the crystallized glass composition, and glass b5 as the amorphous silicate glass composition were weighed to form the mixed powder compositions (weight %) shown in Table 9. Then, an organic binder and toluene as a solvent were added to and mixed with each of the compositions, and the resultant mixture was sufficiently kneaded by a ball mill to prepare a slurry in which the powder mixture was uniformly dispersed. The thus-obtained slurry was degassed under reduced pressure.

TABLE 9

| Sample No. | Mixed powder composition (weight %) | | | | |
|---|---|---|---|---|---|
| | Glass a17 | Glass b5 | $SiO_2$ | $Al_2O_3$ | $Mg_2SiO_4$ |
| 1 | 97 | 2 | 1 | 0 | 0 |
| 2 | 75 | 25 | 1 | 0 | 0 |
| 3 | 50 | 50 | 1 | 0 | 0 |
| 4 | 25 | 75 | 1 | 0 | 0 |
| 5 | 1 | 98 | 1 | 0 | 0 |
| 6 | 74 | 1 | 25 | 0 | 0 |
| 7 | 50 | 25 | 25 | 0 | 0 |
| 8 | 25 | 50 | 25 | 0 | 0 |
| 9 | 1 | 74 | 25 | 0 | 0 |
| 10 | 49 | 1 | 50 | 0 | 0 |
| 11 | 25 | 25 | 50 | 0 | 0 |
| 12 | 1 | 49 | 50 | 0 | 0 |
| 13* | 39 | 1 | 60 | 0 | 0 |
| 14* | 20 | 20 | 60 | 0 | 0 |
| 15* | 1 | 39 | 60 | 0 | 0 |
| 16 | 74 | 1 | 0 | 25 | 0 |
| 17 | 50 | 25 | 0 | 25 | 0 |
| 18 | 25 | 50 | 0 | 25 | 0 |
| 19 | 1 | 74 | 0 | 25 | 0 |
| 20 | 74 | 1 | 0 | 0 | 25 |
| 21 | 50 | 25 | 0 | 0 | 25 |
| 22 | 25 | 50 | 0 | 0 | 25 |
| 23 | 1 | 74 | 0 | 0 | 25 |
| 24 | 50 | 25 | 10 | 15 | 0 |
| 25 | 25 | 50 | 10 | 15 | 0 |
| 26 | 70 | 1 | 29 | 0 | 0 |
| 27 | 35 | 35 | 15 | 15 | 0 |
| 28 | 1 | 85 | 0 | 14 | 0 |

Next, by using each the thus-obtained slurries, a green sheet of 0.2 mm thick was formed on a film by casting using a doctor blade. Each of the green sheets was dried, separated from the film and then punched to form a green sheet of a predetermined size.

A plurality of the green sheets were laminated and then pressed to obtain a compact. Next, the thus-obtained compact was burned at 900° C. for 1 hour at a heating rate of 200° C./hour to obtain a sintered compact comprising each of the powder mixtures, i.e., insulator compositions.

With respect to the sintered compacts comprising the insulator compositions, the relative dielectric constant, insulating resistance, the thermal expansion coefficient, sinterability at 900° C. or less, and crystal phases were evaluated by the same method as Experimental Example 1. The results of evaluation are shown in Table 10. In Tables 9 and 10, sample Nos. marked with * are out of the range of the present invention.

experimental example 5 was used for forming an insulator layer to be evaluated. Particularly, in this experimental example 6, the insulator composition comprising each of the powder mixtures of samples 26 to 28 shown in Tables 9 and 10 was used for forming the insulator layer.

As shown in Table 9, these samples 26 to 28 contain glass a17 as the crystallized glass composition and glass b5 as the amorphous silicate glass composition at different content

TABLE 10

| Sample No. | Relative dielectric constant $\epsilon_r$ | Insulating resistance logIR | Thermal expansion coefficient (ppm/° C.) | Sinterability at 900° C. or less | Presence of crystal phase | | | | |
|---|---|---|---|---|---|---|---|---|---|
| | | | | | Mer | Mo | CS | Geh | Di |
| 1 | 9.5 | >9 | 10.2 | Possible | o | o | x | o | x |
| 2 | 7.6 | >9 | 7.4 | Possible | x | x | o | o | o |
| 3 | 6.2 | >9 | 5.3 | Possible | x | x | o | o | o |
| 4 | 5.0 | >9 | 3.9 | Possible | x | x | x | o | o |
| 5 | 4.1 | >9 | 2.9 | Possible | x | x | x | o | x |
| 6 | 7.6 | >9 | 11.0 | Possible | x | o | x | o | o |
| 7 | 6.1 | >9 | 8.0 | Possible | x | o | x | o | o |
| 8 | 4.9 | >9 | 5.8 | Possible | x | o | x | o | o |
| 9 | 3.9 | >9 | 4.2 | Possible | x | x | x | x | o |
| 10 | 6.0 | >9 | 11.9 | Possible | x | x | o | o | o |
| 11 | 4.8 | >9 | 8.6 | Possible | x | x | o | o | o |
| 12 | 3.9 | >9 | 6.3 | Possible | x | x | x | x | o |
| 13* | — | <9 | — | Impossible | — | — | — | — | — |
| 14* | — | <9 | — | Impossible | — | — | — | — | — |
| 15* | — | <9 | — | Impossible | — | — | — | — | — |
| 16 | 9.1 | >9 | 9.6 | Possible | x | x | o | o | o |
| 17 | 7.3 | >9 | 6.9 | Possible | x | x | o | o | o |
| 18 | 5.9 | >9 | 5.0 | Possible | x | x | o | o | o |
| 19 | 4.8 | >9 | 3.6 | Possible | x | x | x | o | x |
| 20 | 8.8 | >9 | 10.4 | Possible | x | o | o | o | o |
| 21 | 7.1 | >9 | 7.5 | Possible | x | x | o | o | o |
| 22 | 5.7 | >9 | 5.4 | Possible | x | x | o | o | o |
| 23 | 4.6 | >9 | 3.9 | Possible | x | x | x | x | o |
| 24 | 6.8 | >9 | 7.3 | Possible | x | x | o | o | o |
| 25 | 5.5 | >9 | 5.3 | Possible | x | x | o | o | o |
| 26 | 7.5 | >9 | 11.5 | Possible | x | o | x | o | x |
| 27 | 6.5 | >9 | 6.5 | Possible | x | x | o | o | o |
| 28 | 4.4 | >9 | 2.8 | Possible | x | x | x | o | x |

Referring to Table 9 and 10, it is found that in samples 1 to 12 and 16 to 28 within the preferred range, the thermal expansion coefficients of the resultant insulators can be freely changed in the range of about 2.0 ppm/° C. to 12.0 ppm/° C., sintering at a temperature of about 900° C. or less is possible, and the insulators have a relative dielectric constant of about 11 or less, an insulating resistance (logIR) of over about 9, and good characteristics as electric insulating materials.

On the other hand, in samples 13 to 15, the content of the ceramic powder exceeds 50 weight % and thus sintering at 900° C. or less is insufficient to cause deterioration in the insulating resistance.

In Experimental Example 5, only glass a17 was selected as the crystallized glass composition and only glass b5 was selected as the amorphous silicate glass composition to evaluate the mixed insulator compositions. However, it is confirmed that by using the other crystallized glass compositions in the preferred range prepared in Experimental Examples 1 to 3, or the other amorphous silicate glass compositions in the preferred range prepared in Experimental Example 4, the same evaluation results as the above are obtained.

EXPERIMENTAL EXAMPLE 6

In Experimental Example 6, each of the powder mixtures, i.e., the insulator compositions, prepared in the above ratios. The samples further contain at least one of $SiO_2$ (quartz) and $Al_2O_3$ (alumina) as the ceramic composition at different contents. As shown in Table 10, samples 26, 27 and 28 exhibit different thermal expansion coefficients, i.e., 11.5 ppm/° C., 6.5 ppm/° C., and 2.8 ppm/° C., respectively.

40 parts by weight of an organic vehicle obtained by dissolving an acrylic resin in α-terpineol was added to 60 parts by weight of each of the powder mixtures of samples 26 to 28, and the resultant mixture was kneaded to prepare insulator paste.

On the other hand, a 10-cm square $Al_2O_3$ substrate and MgO substrate having a thickness of 0.635 mm were prepared as substrates for a laminated electronic part.

Figure 4:
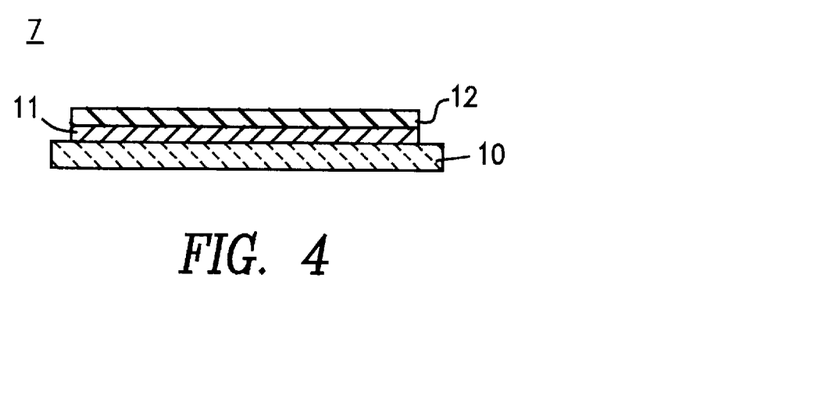
FIG. 4 is a sectional view showing a laminated electronic part in accordance with another embodiment of the present invention.
Figure 5:
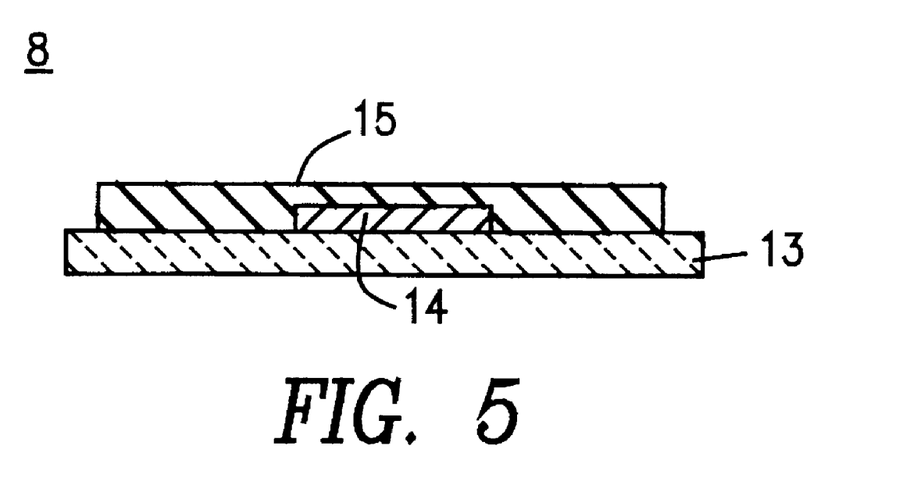
FIG. 5 is a sectional view showing a laminated electronic part in accordance with a further embodiment of the present invention.
Figure 6:
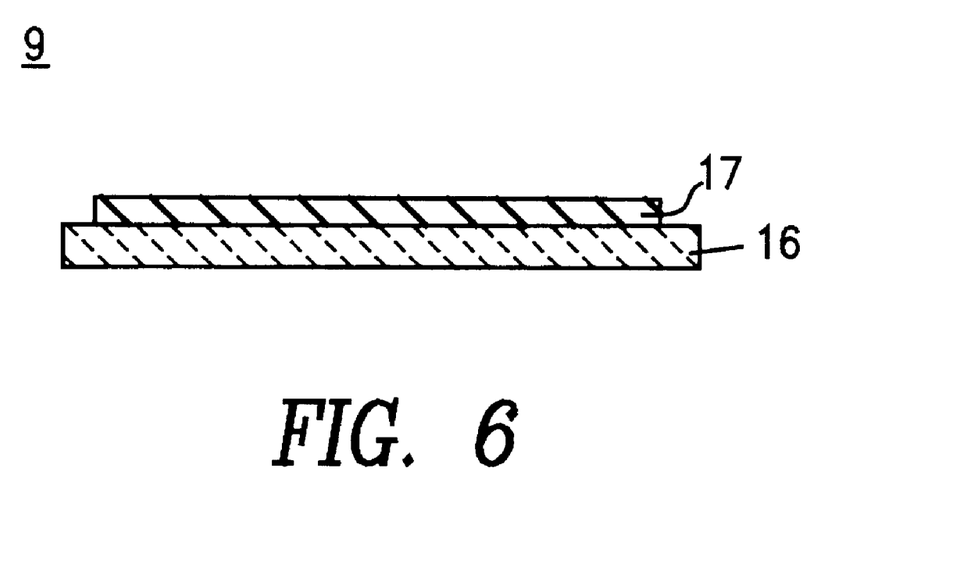
FIG. 6 is a sectional view showing a laminated electronic part in accordance with a still further embodiment of the present invention.

By using each of the substrates, the laminated electronic part 1 shown in FIG. 3, and the laminated electronic parts 7, 8, and 9 shown in FIGS. 4, 5, and 6, respectively, were prepared.

In further detail, in order to prepare the laminated electronic part 1 shown in FIG. 3, a silver paste was screen-printed on the substrate 2 and burned at a temperature of 900° C. in air to form the circular conductor layer 3 having a thickness of about 8 μm and a diameter of 8 mm after burning. Then, the insulator paste was screen-printed on the conductor layer 3 and burned at a temperature of 900° C. in air to form the circular insulator layer 4 having a thickness of about 40 μm and a diameter of 6 mm after burning. Next, a silver paste was screen-printed on the insulator layer 4 and burned at a temperature of 900° C. in air to form the circular conductor layer 5 having a diameter of 4 mm, and form the guard layer 6 so as to surround the conductor layer 5 at a distance of 500 μm from the edge of the conductor layer 5, to complete the intended laminated electronic part 1.

In order to prepare the laminated electronic part 7 shown in FIG. 4, a silver paste was screen-printed on a substrate 10 and then burned at a temperature of 900° C. in air to form a 9-cm square electrode, i.e., a conductor layer 11, having a thickness of about 8 mm after burning. Then, the insulator paste was screen-printed on the conductor layer 11 and burned at a temperature of 900° C. in air to form a 9-cm square insulator layer 12 having a thickness of about 40 mm after burning.

In order to prepare the laminated electronic part 8 shown in FIG. 5, a silver paste was screen-printed on a substrate 13 and burned at a temperature of 900° C. in air to form a 3-cm square electrode, i.e., a conductor layer 14, having a thickness of about 8 mm after burning. Then, the insulator paste was screen-printed to cover the conductor layer 14 and burned at a temperature of 900° C. in air to form a 9-cm square insulator layer 15 having a thickness of about 40 μm after burning.

In order to prepare the laminated electronic part 9 shown in FIG. 6, the insulator paste was screen-printed on a substrate 16 and then burned at a temperature of 900° C. in air to form a 9-cm square insulator layer 17 having a thickness of about 40 μm after burning.

Next, by using the laminated electronic part 1 shown in FIG. 3, the characteristics of a capacitor comprising the insulator layer 4 as a dielectric layer were measured by using the conductor layers 3 and 5 as opposite electrodes to evaluate the characteristics of the insulator layer 4. More specifically, the electrostatic capacity was measured by using the guard layer 6 as a guard under conditions of a frequency 1 MHZ, a voltage of 1 Vrms and a temperature of 25° C., and the relative dielectric constant ($\epsilon_r$) was calculated from the measured electrostatic capacity and the dimensions of the capacitor.

Furthermore, a voltage of 50 V was applied for 1000 hours under conditions of 85° C. and 85% RH, and then a DC voltage of 50 V was further applied for 1 minute to measure the insulating resistance (IR).

By using each of the laminated electronic parts 7, 8, and 9 shown in FIGS. 4, 5, and 6, respectively, the amount of warping of each of the substrates 10, 13 and 16 was measured by a micrometer. Namely, each of the laminated electronic parts 7 to 9 was placed faceup and facedown on a flat plate having a size larger than 10-cm square in a state so that the thickness of each of the laminated electronic parts 7 to 9 was measured in each of the face-up and face-down states, and a different between the thicknesses was considered as an amount of warping.

The appearance of the insulator layer 17 of the laminated electronic part 9 shown in FIG. 6 was observed on a scanning electron microscope to evaluate the presence of cracks on the surface of the film which constituted the insulator layer 17.

The results are shown in Table 11. In Table 11, in the column of "Amount of warping", "Electrode (9 cm)" means the laminated electronic part 7 shown in FIG. 4; "Electrode (3 cm)" means the laminated electronic part 8 shown in FIG. 5; "No electrode" means the laminated electronic part 9 shown in FIG. 6.

TABLE 11

| Substrate | Insulator layer | Relative dielectric constant $\epsilon_r$ | Insulating resistance logIR | Amount of warping (μm) | | | Presence of crack on film |
|---|---|---|---|---|---|---|---|
| | | | | Electrode (9 cm) | Electrode (3 cm) | No electrode | |
| Al$_2$O$_3$ | Sample 26 | 7.8 | <9 | −400 | −350 | −300 | Present |
| | Sample 27 | 6.6 | >9 | −100 | −50 | 0 | No |
| | Sample 28 | 4.5 | >9 | 0 | 100 | 500 | No |
| MgO | Sample 26 | 7.6 | >9 | −50 | 0 | 0 | No |
| | Sample 27 | 6.6 | >9 | 100 | 250 | 300 | No |
| | Sample 28 | 4.6 | >9 | 300 | 500 | 600 | No |

The thermal expansion coefficient of each of the components contained in the samples shown in table 11 was as follows.

Al$_2$O$_3$ substrate . . . 7.0 ppm/° C.

MgO substrate . . . 11.0 ppm/° C.

Conductor layer comprising silver paste . . . 10 ppm/° C.

Insulator layer (sample 26) . . . 11.5 ppm/° C. (refer to Table 10)

Insulator layer (sample 27) . . . 6.5 ppm/° C. (refer to Table 10)

Insulator layer (sample 28) . . . 2.8 ppm/° C. (refer to Table 10)

Table 11 indicates that the amount of warping depends upon the thermal expansion coefficient of the substrate used, the thermal expansion coefficient of the conductor layer, the thermal expansion coefficient of the insulator layer, the design area of the conductor layer, etc. With the Al$_2$O$_3$ substrate, and the insulator layer of sample 26, the thermal expansion coefficient of the insulator layer is higher than that of the substrate with a great difference therebetween, thereby causing cracks and accordingly deteriorating the insulating resistance.

It is thus found that by changing or controlling the thermal expansion coefficient of the insulator layer according to the materials of the substrate and the conductor film, and the circuit design comprising the conductor film, warping of the substrate can be decreased, and the occurrence of cracks can be suppressed.

As described above, the insulator composition of the present invention can be sintered at a relatively low temperature, and thus the insulator paste containing the insulator composition can be sintered at a relatively low temperature to form an insulator layer provided in a laminated electronic part. Therefore, a laminated electronic part can be obtained by simultaneously burning the insulator paste and conductor paste, in which the insulator layer and a conductor layer obtained by burning the silver-system, copper-system or gold-system conductor paste are laminated.

In the insulator composition of the present invention, the thermal expansion coefficient can easily be changed by changing the ratio of crystallized glass composition, amorphous silicate glass composition and ceramic composition. Therefore, in the laminated electronic part having a structure in which the insulator layer obtained by burning insulator paste containing the insulator composition, and the conductor layer obtained by burning conductor paste are laminated, the thermal expansion coefficient of the insulator layer can easily be changed or controlled. Furthermore, the thermal expansion coefficient of the insulator layer can be changed according to the material of the conductor layer or the circuit design comprising the conductor layer, and further according to the material of the substrate when the laminated structure is formed on an appropriate substrate, thereby advantageously suppressing warping and cracks.

Furthermore, the insulator composition of the present invention is sintered to obtain an electric insulating material having a low dielectric constant and high insulation reliability. Therefore, the insulator composition can be advantageously used as an electric insulating material for a laminated electronic part such as a multilayered circuit board or the like, which has smaller size and higher density, and which is required to have a high propagation velocity.

The insulator composition of the present invention can be made sinterable at 900° C. or less by adding about 5 to 28 parts by weight of $Al_2O_3$ to a total of 100 parts by weight of $SiO_2$, MgO and CaO as the main components of the crystallized glass composition contained in the insulator composition. When the amorphous silicate glass composition comprises borosilicate glass containing $SiO_2$, $B_2O_3$ and $K_2O$, the ratio by weight % of $SiO_2$, $B_2O_3$ and $K_2O$ is selected in the region surrounded by points E, F, G and H shown in ternary composition diagram of FIG. 2, the insulation composition is made sinterable at 900° C. or less. Alternatively, the insulation composition is made sinterable at 900° C. or less by setting the content of the ceramic composition thereof to about 50 weight % or less. Therefore, when forming the conductor layer provided in the laminated electronic part, a silver-system, copper-system or gold-system conductor paste can be burned at the same time as the insulator paste without causing a problem.

What is claimed is:

1. An insulator composition comprising:
    a crystallized glass comprising $SiO_2$, MgO and CaO in a composition ratio by weight % ($SiO_2$, MgO, CaO) in a region surrounded by point A (30, 25, 45), point B (30, 5, 65), point C (45, 5, 50) and point D (45, 25, 30) of a ternary composition diagram thereof, and $Al_2O_3$;
    an amorphous silicate glass; and
    a ceramic.

2. An insulator composition according to claim 1, wherein the crystallized glass comprises about 5 to 28 parts by weight of $Al_2O_3$ based on a total of 100 parts by weight of the $SiO_2$, MgO and CaO.

3. An insulator paste comprising an insulator composition according to claim 2 and an organic vehicle.

4. An insulator composition according to claim 2, wherein the crystallized glass is a composition that when heated at a temperature higher than the crystallization temperature, at least one crystal phase selected from the group consisting of merwinite, monticellite, calcium silicate, gehlenite and diopside is precipitated.

5. An insulator composition according to claim 4, wherein the crystallized glass composition comprises 0 to about 20 parts by weight of $B_2O_3$, and 0 to about 5 parts by weight of at least one of $Li_2O$, $K_2O_3$ and $Na_2O$.

6. An insulator composition according to claim 5, wherein the amorphous silicate glass comprises borosilicate glass.

7. An insulator composition according to claim 6, wherein the borosilicate glass contains about 75 weight % or more of $SiO_2$.

8. An insulator composition according to claim 7, wherein the borosilicate glass contains $SiO_2$, $B_2O_3$ and $K_2O_3$ at a composition ratio by weight % ($SiO_2$, $B_2O_3$, $K_2O$) in the region surrounded by point E (75, 25, 0), point F (75, 20, 5), point G (85, 10, 5) and point H (85, 15, 0) in a ternary composition diagram thereof.

9. An insulator composition according to claim 6, wherein the ceramic composition comprises at least one of alumina, forsterite and quartz.

10. An insulator composition according to claim 9, wherein the content of the ceramic is about 50 weight % or less.

11. An insulator composition according to claim 10, wherein the crystallized glass has a composition which after sintering has a thermal expansion coefficient of about 7 ppm/° C. or more, and the amorphous silicate glass has a composition which after sintering has a thermal expansion coefficient of about 4 ppm/° C. or less, whereby the thermal expansion coefficient of the insulator composition after sintering is in the range of about 2 to 12 ppm/° C.

12. An insulator paste comprising an insulator composition according to claim 11, and an organic vehicle.

13. An insulator composition according to claim 1, wherein the composition is such that at least one crystal phase selected from the group consisting of merwinite, monticellite, calcium silicate, gehlenite, and diopside is precipitated after burning of the insulator composition.

14. An insulator composition according to claim 1, wherein the amorphous silicate glass comprises borosilicate glass.

15. An insulator composition according to claim 1, wherein the content of the ceramic is about 50 weight % or less.

16. An insulator paste comprising an insulator composition according to claim 1 and an organic vehicle.

* * * * *